(12) United States Patent
Hudson et al.

(10) Patent No.: US 8,780,158 B2
(45) Date of Patent: Jul. 15, 2014

(54) LASER SCAN UNIT HOUSING FOR AN IMAGING DEVICE

(75) Inventors: Randall Lee Hudson, Lexington, KY (US); Jason Lee Rowe, Richmond, KY (US)

(73) Assignee: Lexmark International, Inc., Lexington, KY (US)

( * ) Notice: Subject to any disclaimer, the term of this patent is extended or adjusted under 35 U.S.C. 154(b) by 34 days.

(21) Appl. No.: 13/250,157

(22) Filed: Sep. 30, 2011

(65) Prior Publication Data

US 2013/0070041 A1    Mar. 21, 2013

Related U.S. Application Data

(60) Provisional application No. 61/537,043, filed on Sep. 20, 2011.

(51) Int. Cl.
*B41J 2/385* (2006.01)
*B41J 2/435* (2006.01)
*B41J 15/14* (2006.01)

(52) U.S. Cl.
USPC ........... 347/245; 347/134; 347/138; 347/232; 347/242; 347/243; 347/263

(58) Field of Classification Search
USPC ......... 347/111, 112, 129, 134, 138, 224, 225, 347/232, 233, 241, 242, 243, 245, 263
See application file for complete search history.

(56) References Cited

U.S. PATENT DOCUMENTS

| | | | | |
|---|---|---|---|---|
| 5,245,481 | A * | 9/1993 | Kaneko et al. | 359/896 |
| 2007/0253052 | A1 * | 11/2007 | Kato et al. | 359/216 |
| 2009/0110413 | A1 * | 4/2009 | Takeuchi et al. | 399/27 |

\* cited by examiner

*Primary Examiner* — Alessandro Amari
*Assistant Examiner* — Kendrick Liu (57) ABSTRACT

A housing for the scan unit printhead of an imaging device. The housing is substantially bowl shaped having a plurality of mounting surfaces extending inwardly toward a central region of the housing. The housing is constructed from a metal composition. The scan unit includes a plurality of light sources and an optical assembly operatively coupled thereto. The housing mounting surfaces support components of the optical assembly using an adhesive, without additional mounting hardware.

19 Claims, 11 Drawing Sheets

LASER SCAN UNIT HOUSING FOR AN IMAGING DEVICE

CROSS REFERENCES TO RELATED APPLICATIONS

The present application is related to and claims priority from U.S. patent application 61/537,043, filed Sep. 20, 2011, entitled, "Laser Scan Unit Housing for an Imaging Device," the contents of which are incorporated herein by reference its entirety.

STATEMENT REGARDING FEDERALLY SPONSORED RESEARCH OR DEVELOPMENT

None.

REFERENCE TO SEQUENTIAL LISTING, ETC.

None.

BACKGROUND

1. Field of the Disclosure

Example embodiments of the present disclosure relate generally to a laser scan unit for an image scanning device, and more particularly to a housing for a laser scan unit having a metal construction and simplified mounting mechanisms for the optical components of the scan unit.

2. Description of the Related Art

Multibeam and single beam laser scanners typically include a housing for holding the scanner's optical components that is constructed from a thermoplastic. Such thermoplastic housings disadvantageously shrink non-uniformly during the molding and subsequent cooling process in the manufacture of the housing. The inconsistencies associated with the molding and cooling of these critical parts creates two primary issues.

First, part-to part dimensional variation of features for mounting sensitive optical components, such as mirrors and lenses, creates the need for assembly adjustment mechanisms during production as well as additional components. Second, during normal operation of electrophotographic printers, the fuser assembly, the laser scanner motor and other printer components and assemblies may create heat. As the thermoplastic housing heats, it expands thermally at two different coefficient of expansion based rates: parallel to the flow and fiber direction of the plastic during injection molding, and perpendicular to the flow and fiber direction of the plastic. The complex shape and features of the housing design, with a multitude of flow disruptions and directions, does not expand uniformly when heated, causing the part to warp or change shape along with the absolute expansion of the housing. This change of size and shape of the housing, which locates the critical laser pointing and focal elements, creates print quality issues associated with change of spot size and location of the laser image on the pc drum, primarily color to color registration of the four color planes (CMYK).

Based upon the foregoing, a need exists for an improved laser scan unit for an imaging device.

SUMMARY

Example embodiments of the present disclosure overcome shortcomings of prior laser scan units and thereby satisfy a need for a laser scanner having reduced part-to-part variation. According to an example embodiment, a scan unit for an imaging device includes a mirror movable about an axis; one or more light sources, a light beam generated by each light source being directed towards the movable mirror such that movement of the mirror causes each light beam that is reflected by the mirror to follow a distinct scan pattern. The scan unit may include an optical assembly associated with each reflected light beam so as to form an optical path for the reflected light beam from the scan unit. The optical assembly may include at least one mirror that is stationary during operation of the imaging device and at least one lens. The scan unit may further include a housing to which the movable mirror, the one or more light sources and the optical assembly are secured. The housing may include a first group of one or more mounting surfaces supporting the at least one stationary mirror of the optical assembly, the at least one stationary mirror mounted on and supported by the first group of one or more mounting surfaces via at least one adhesive layer, without any mounting hardware.

The housing may be constructed from a metal and formed from a deep drawn process.

In an example embodiment, the housing includes a convex outer surface to which the one or more light sources are mounted and a concave inner surface in which the movable mirror and the optical assembly are disposed. The housing mounting surfaces may extend inwardly from the inner surface of the housing towards a central region thereof, the mounting surfaces supporting the at least one stationary mirror and the at least one lens of the optical assembly. In an example embodiment, each mounting surface may be formed from the housing and bent inwardly, and include one or more bend angles.

BRIEF DESCRIPTION OF THE DRAWINGS

The above-mentioned and other features and advantages of the various embodiments, and the manner of attaining them, will become more apparent and will be better understood by reference to the accompanying drawings.

DETAILED DESCRIPTION

The following description and drawings illustrate embodiments sufficiently to enable those skilled in the art to practice the present invention. It is to be understood that the disclosure is not limited to the details of construction and the arrangement of components set forth in the following description or illustrated in the drawings. The invention is capable of other embodiments and of being practiced or of being carried out in various ways. For example, other embodiments may incorporate structural, chronological, electrical, process, and other changes. Examples merely typify possible variations. Individual components and functions are optional unless explicitly required, and the sequence of operations may vary. Portions and features of some embodiments may be included in or substituted for those of others. The scope of the application encompasses the appended claims and all available equivalents. The following description is, therefore, not to be taken in a limited sense, and the scope of the present invention is defined by the appended claims.

Also, it is to be understood that the phraseology and terminology used herein is for the purpose of description and should not be regarded as limiting. The use of "including," "comprising," or "having" and variations thereof herein is meant to encompass the items listed thereafter and equivalents thereof as well as additional items. Unless limited otherwise, the terms "connected," "coupled," and "mounted," and variations thereof herein are used broadly and encompass direct and indirect connections, couplings, and mountings. In addition, the terms "connected" and "coupled" and variations thereof are not restricted to physical or mechanical connections or couplings.

Reference will now be made in detail to the exemplary embodiment(s) of the present disclosure, as illustrated in the accompanying drawings. Whenever possible, the same reference numerals will be used throughout the drawings to refer to the same or like parts.

Figure 1:
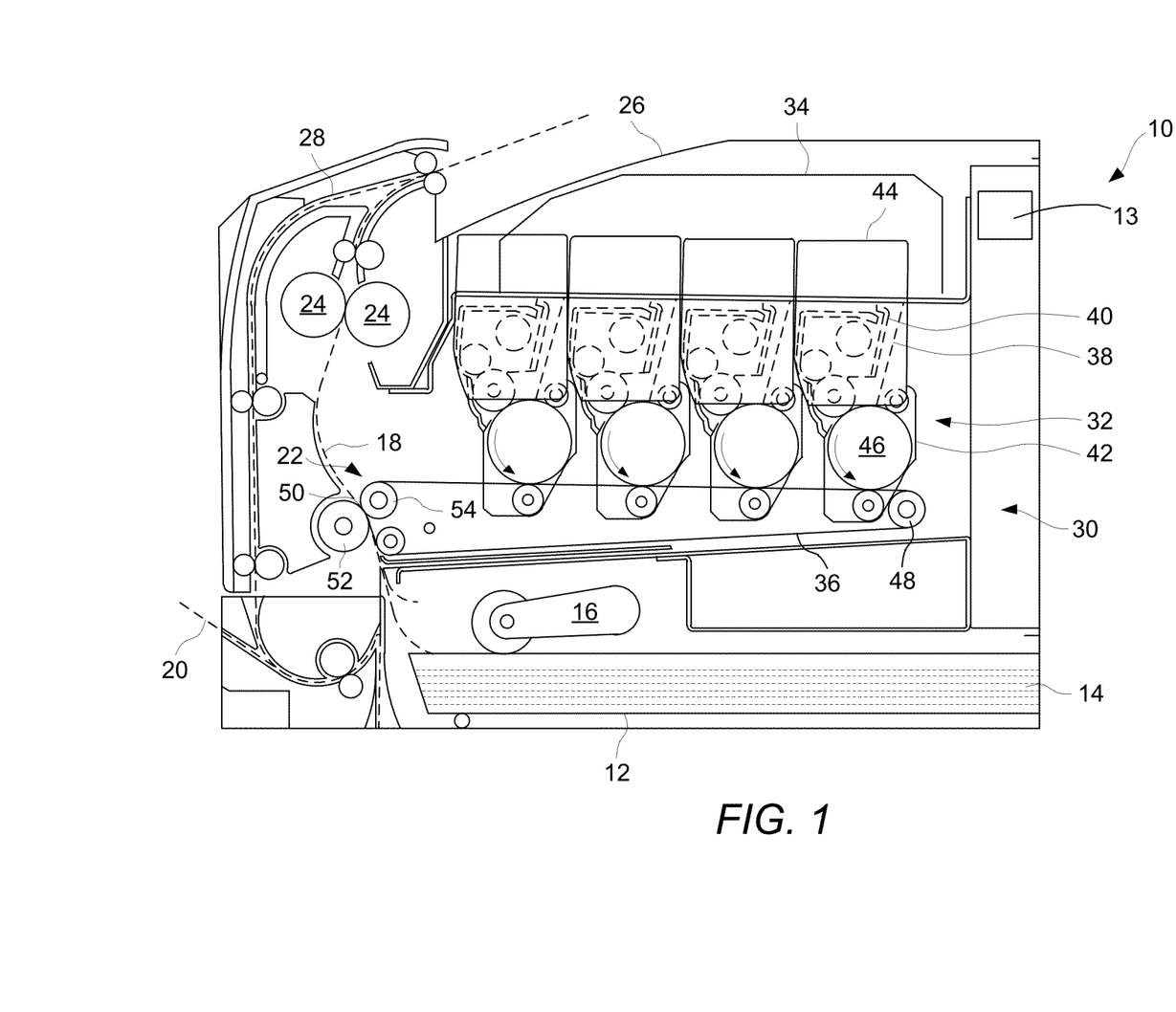
FIG. 1 is a cross sectional view of an electrophotographic imaging device having a scan unit printhead according to example embodiments of the present disclosure.

One embodiment of an imaging apparatus 10 according to an example embodiment is illustrated in FIG. 1. Imaging apparatus 10 includes an input tray 12 sized to contain a stack of media sheets 14. A pick mechanism 16 is positioned adjacent the input tray 12 for moving a top-most sheet from the stack 14 and into a media path 18. Alternatively, the media sheets 14 may move into the media path 18 via a manual feed 20. The media sheets 14 move from the input tray 12 along the media path 18 to a transfer area 22. The media sheet 14 receives one or more toner images at the transfer area 22. The media sheet 14 with the toner images next moves through a fuser 24 to adhere the toner images to the media sheet 14. The media sheet 14 is then either discharged into an output tray 26 or moved into a duplex path 28 for forming a toner image on a second side of the media sheet 14.

An image formation area 30 of the imaging apparatus 10 includes an imaging unit 32, a laser printhead 34, and a transfer member 36. Imaging unit 32 includes one or more imaging stations 38 that each includes a developer unit 40, a photoconductor unit 42, and a toner cartridge 44. For clarity, the units 40, 42, and cartridge 44 are labeled on only one of the imaging stations 38 in FIG. 1. In one embodiment, imaging apparatus 10 is a monochromatic imaging apparatus including a single imaging station 38 for forming toner images in a single color. In another embodiment, the imaging unit 32 includes multiple separate imaging stations 38, each being substantially the same except for the color of the toner. In one embodiment, the imaging unit 32 includes four imaging stations 38, each of the imaging station 38 contains the toner cartridge 44 having one of black, magenta, cyan, or yellow toner.

Laser printhead 34 includes a laser diode that discharges a surface of a corresponding photoconductive (PC) member 46 within each of the imaging stations 38. Toner from a developer unit 40 in the imaging station 38 attracts to the surface area of the PC members 46 discharged by the laser printhead 34.

The transfer member 36 extends continuously around a series of rollers 48. Transfer member 36 receives the toner images from each of the PC members 46. In one embodiment, the toner images from each of the PC members 46 are placed onto transfer member 36 in an overlapping arrangement. In one embodiment, a multi-color toner image is formed during a single pass of the transfer member 36. By way of example, the yellow toner may be placed first on the transfer member 36, followed by cyan, magenta, and black. After receiving the toner images, transfer member 36 moves the images to the second transfer area 22 where the toner images are transferred to the media sheet 14. The second transfer area 22 includes a nip 50 formed by a transfer roller 52 and the backup roller 54. The media sheet 14 moves along the media path 18 through the nip 50 to receive the toner images from the transfer member 36. The media sheet 14 with the toner images next moves through the fuser 24 and is then discharged at the output tray 26 or moved into the duplex path 28.

To effect the imaging operation, a controller 13 manipulates and converts data defining each of the yellow, cyan, magenta and black image planes into separate corresponding laser pulse video signals, and the video signals are then communicated to printhead 34 (also referred to herein as a "laser scanning unit").

Figure 2:
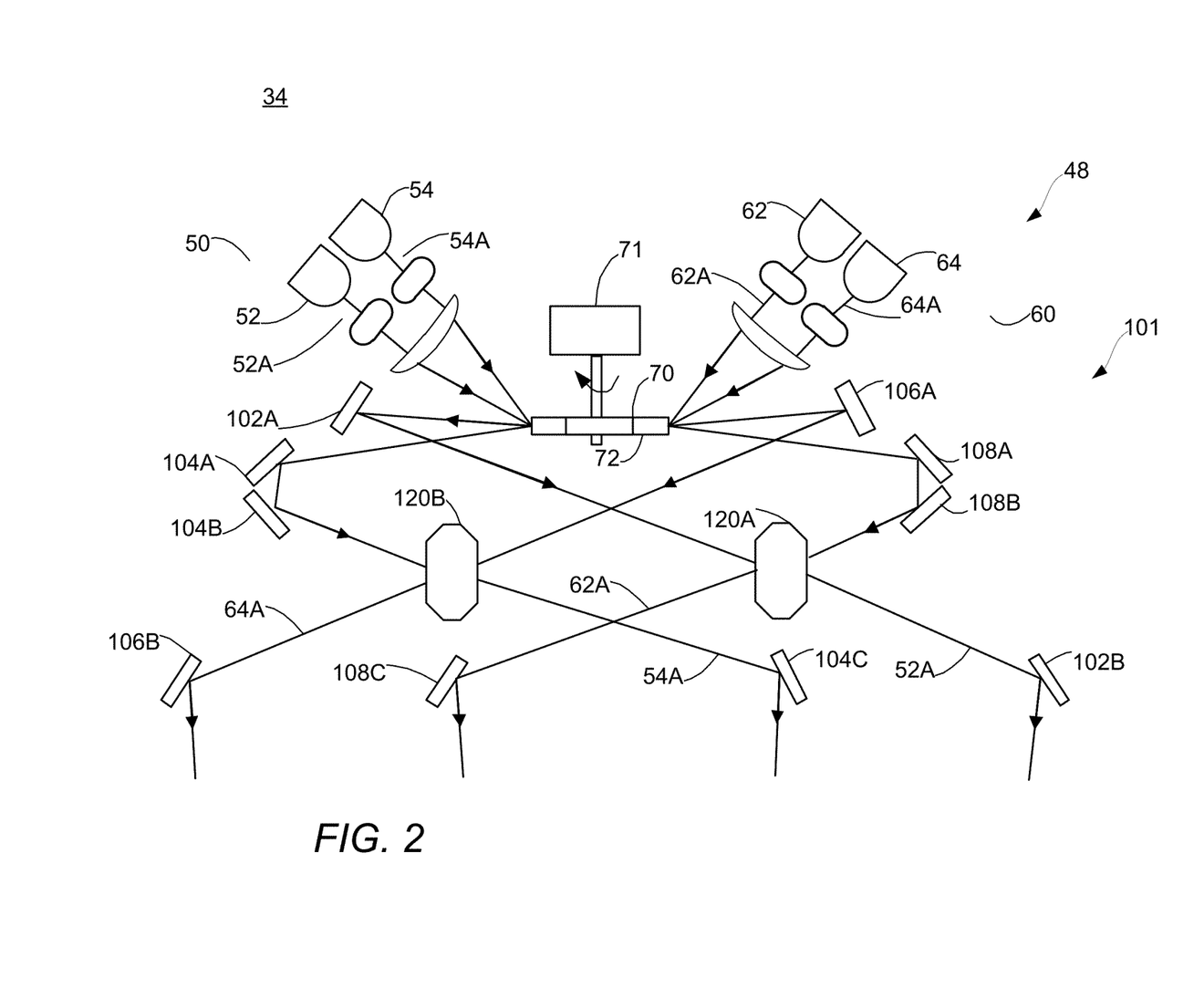
FIG. 2 is a diagram illustrating the optical assemblies of the scan unit printhead of FIG. 1.

With reference to FIG. 2, the printhead 34 may include a single rotatable polygonal mirror 70 that is powered by a motor 71, and a pre-scan optical assembly 48 including first and second pre-scan laser diode/lens assemblies 50 and 60. The mirror 70 is supported for rotation about a rotational axis and comprises a plurality of facets 72. It is understood that mirrors other than a rotatable, polygonal mirror may be utilized in printhead 34. In an alternative embodiment, printhead 34 may include an oscillating mirror, such as a galvanometric mirror, instead of polygonal mirror 70. The use of rotatable, polygonal mirrors and oscillating, galvonometric mirrors in printheads for laser printers is well known and will not be described in greater detail herein for reasons of simplicity.

The first pre-scan assembly 50 comprises first and second laser diodes 52 and 54, each of which generates a corresponding laser beam 52A and 54A. The second pre-scan assembly 60 comprises third and fourth laser diodes 62 and 64, each which generates a corresponding laser beam 62A and 64A. Each of pre-scan assemblies 50 and 60 may include one or more lenses, such as a collimation lens associated with each laser diode 52, 54, 62, 64.

Each of the laser beams 52A, 54A, 62A, 64A is modulated so as to write pixels or Pels according to an associated one of the video signals from the controller 13 as the beam scans along a corresponding scan path. In particular, the first laser beam 52A is modulated according to a video signal corresponding to the cyan image plane. The second laser beam 54A is modulated according to a video signal corresponding to the magenta image plane. The third laser beam 62A is modulated according to a video signal corresponding to the black image plane. The fourth laser beam 64A is modulated according to a video signal corresponding to the yellow image plane.

Figure 3:
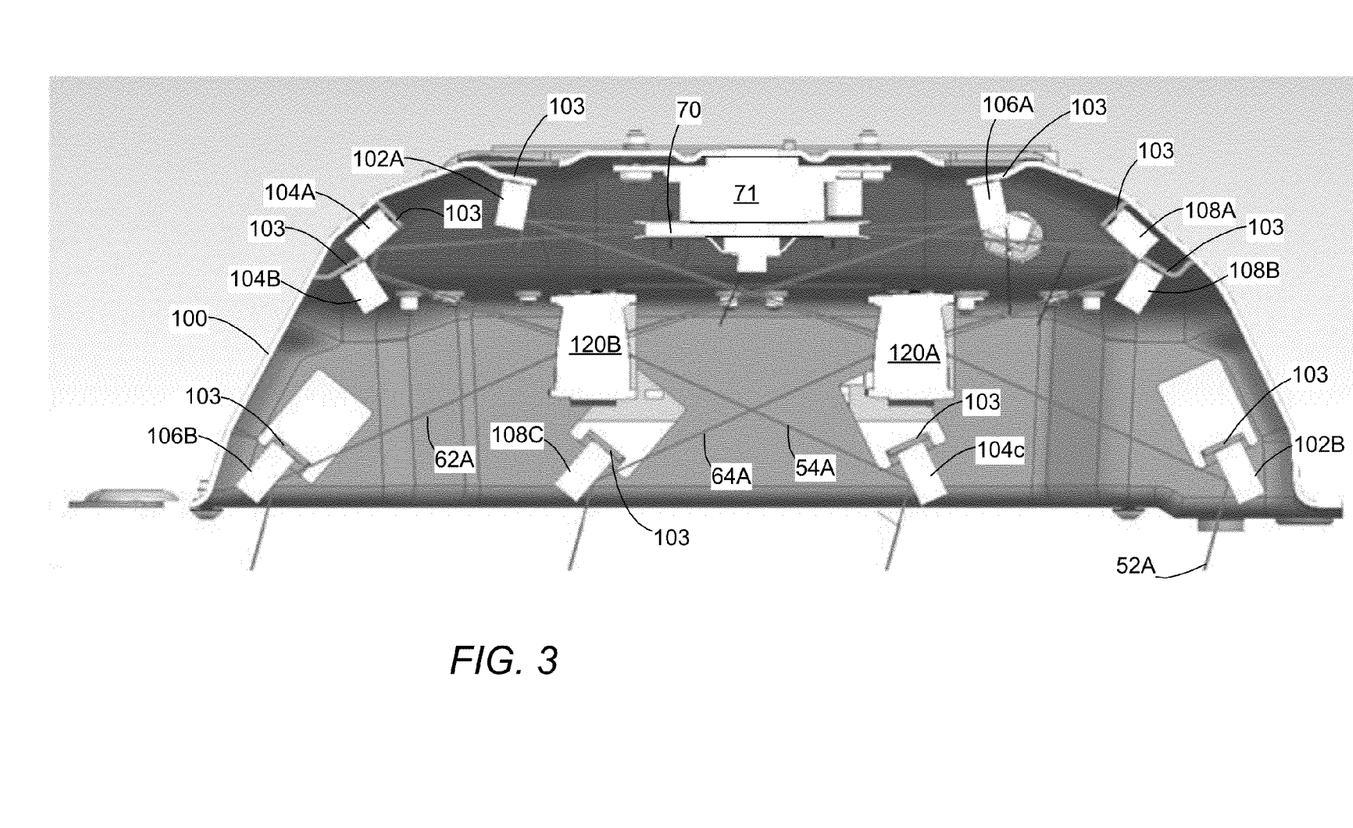
FIG. 3 is a cross sectional view of the scan unit of FIGS. 1 and 2.

Each laser beam 52A, 54A, 62A, 64A is reflected off the rotating polygonal mirror 70 and is directed towards a corresponding one of the photoconductive drums 46 by select mirrors and lenses in a post-scan optical assembly 101, as shown in FIGS. 2 and 3. Beam 52A, after being reflected off the rotating polygonal mirror 70, is reflected by reflection mirror 102A and passes through a first lens 120A and is then reflected by reflection mirror 102B before exiting printhead 34. The second beam 54A, after reflecting from rotating polygonal mirror 70, is reflected by reflection mirrors 104A and 104B, passes through lens 120B, and is reflected by mirror 104C before exiting printhead 34. Third beam 62A, after being reflected by rotating polygonal mirror 70, is reflected by mirror 106A, passes through lens 120B and is reflected by mirror 106B before exiting printhead 34. Fourth beam 64A, after reflecting from rotating polygonal mirror 70, is reflected by reflection mirrors 108A and 108B, passes through lens 120A, and is reflected by mirror 108C before exiting printhead 34.

The rotation of the polygonal mirror 70 and positioning of the mirrors 102A-102B, 104A-104C, 106A-106B and 108A-108C and lenses 120A-120B of the post-scan optical assembly 101 causes each laser beam 52A, 54A, 62A and 64A to repeatedly sweep, along a corresponding scan path in the scan direction, across its corresponding photoconductive drum 46 so as to write Pels to form a latent image on the drum.

It is understood that pre-scan assemblies 50, 60 and post-scan assembly 101 may use a different number and arrangement of mirrors and lens in creating laser beams 52A, 54A, 62A and 64A that form scan patterns on photoconductive drums 46.

Figure 4:
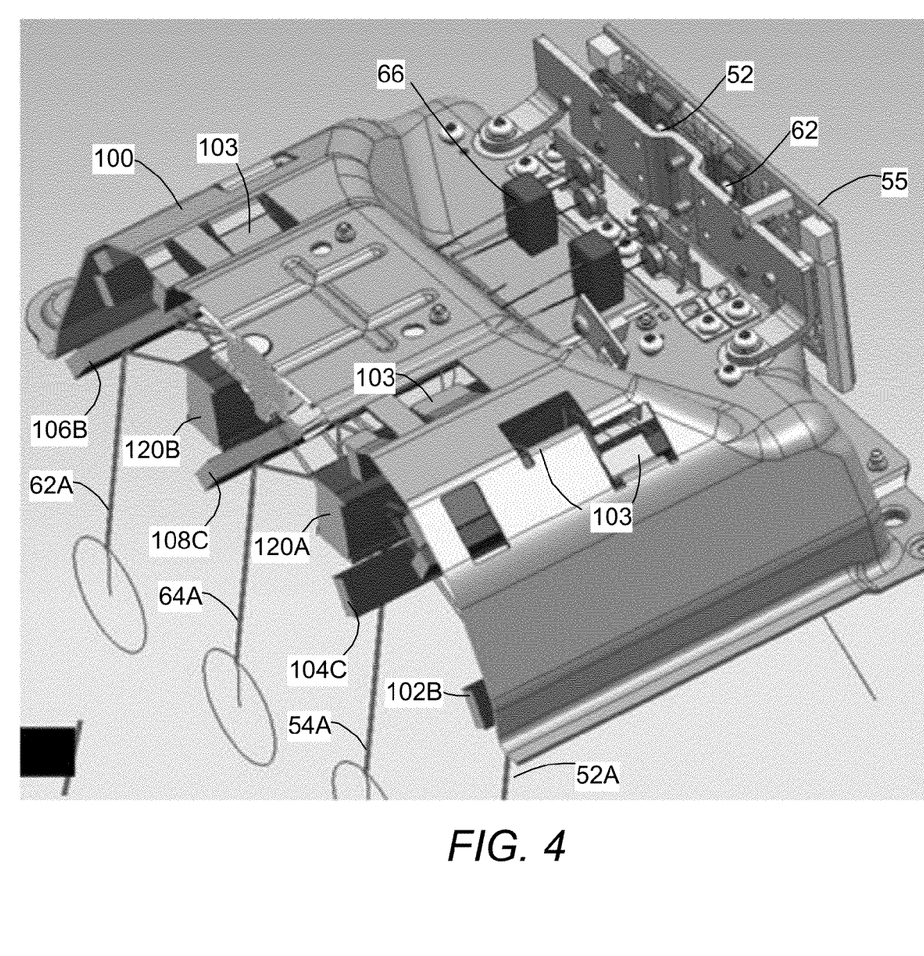
FIG. 4 is a perspective partial view of the scan unit of FIG. 3.

Printhead 34 includes a housing 100 in which pre-scan assemblies 50, 60 and post-scan assembly 101 are disposed. With reference to FIGS. 3-7, housing 100 is substantially bowl shaped, having a convex outer surface and a concave inner surface to which components of assemblies 48 and 101 are connected. Housing 100 may have a substantially rectangular or square opening and four sides 100A-100D. In an example embodiment, pre-scan assemblies 50, 60 are mounted along the outer surface of housing 100, as shown in FIG. 4. Laser diodes 52, 54, 62, 64 may be disposed on one or more printed circuit boards 55 or the like, which are mounted to housing 100 so that laser beams 52A, 54A, 62A, 64A pass through openings in housing 100 and reflect off of rotating mirror 70. Optical lenses of pre-scan assemblies 50, 60, including one or more collimation lenses 66, may also be mounted along the outer surface of housing 100 in the optical path of beams 52A, 54A, 62A, 64A.

It is understood that housing 100 may have a shape other than a bowl-shape having convex outer and concave inner surfaces. According to an example embodiment, housing 100 may have a more complex shape, such as having a substantially H-shaped cross section.

Figure 5:
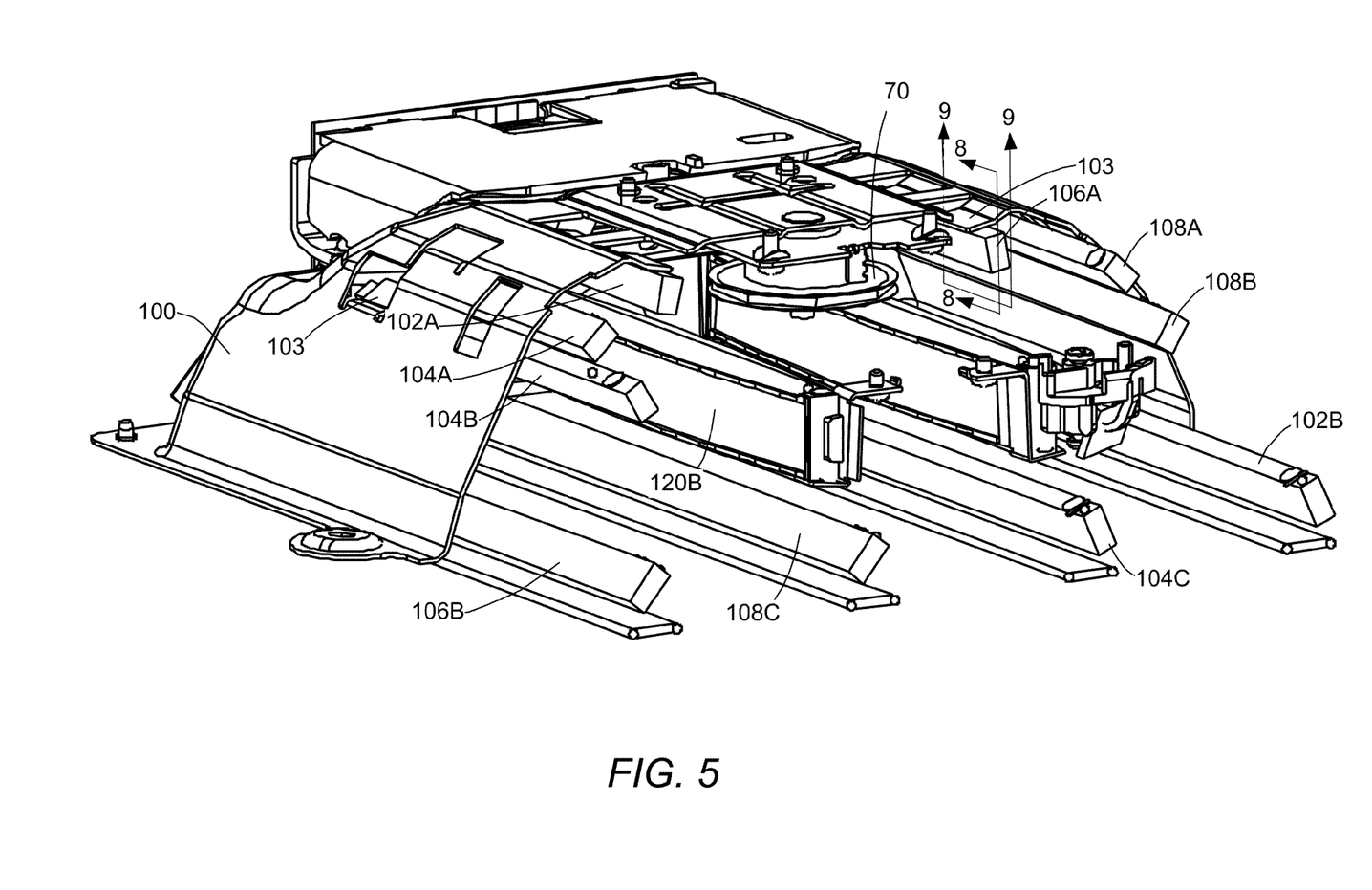
FIG. 5 is another perspective partial view of the scan unit of FIG. 3.
Figure 6:
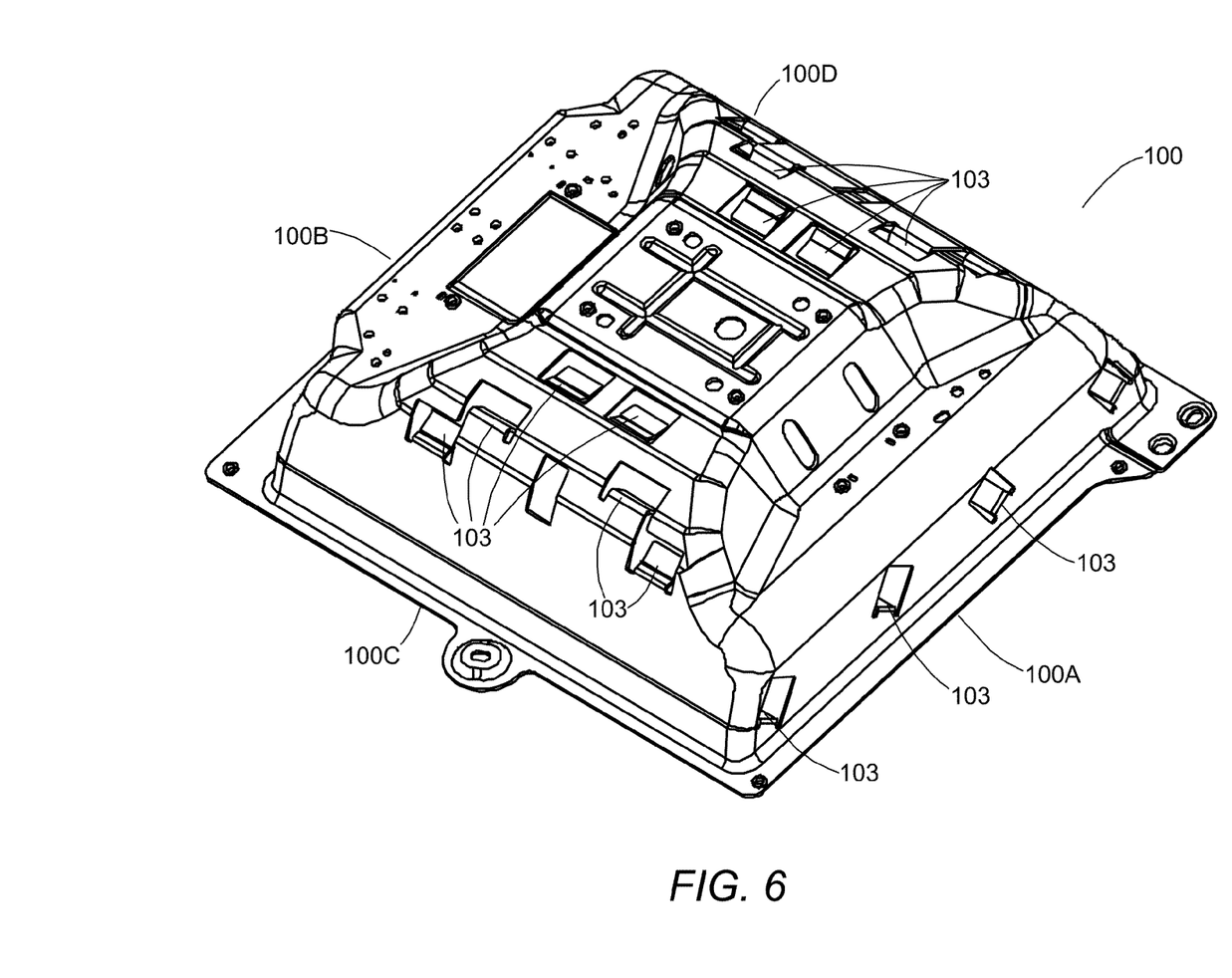
FIG. 6 is a top perspective view of the housing of the scan unit of FIG. 3.
Figure 7:
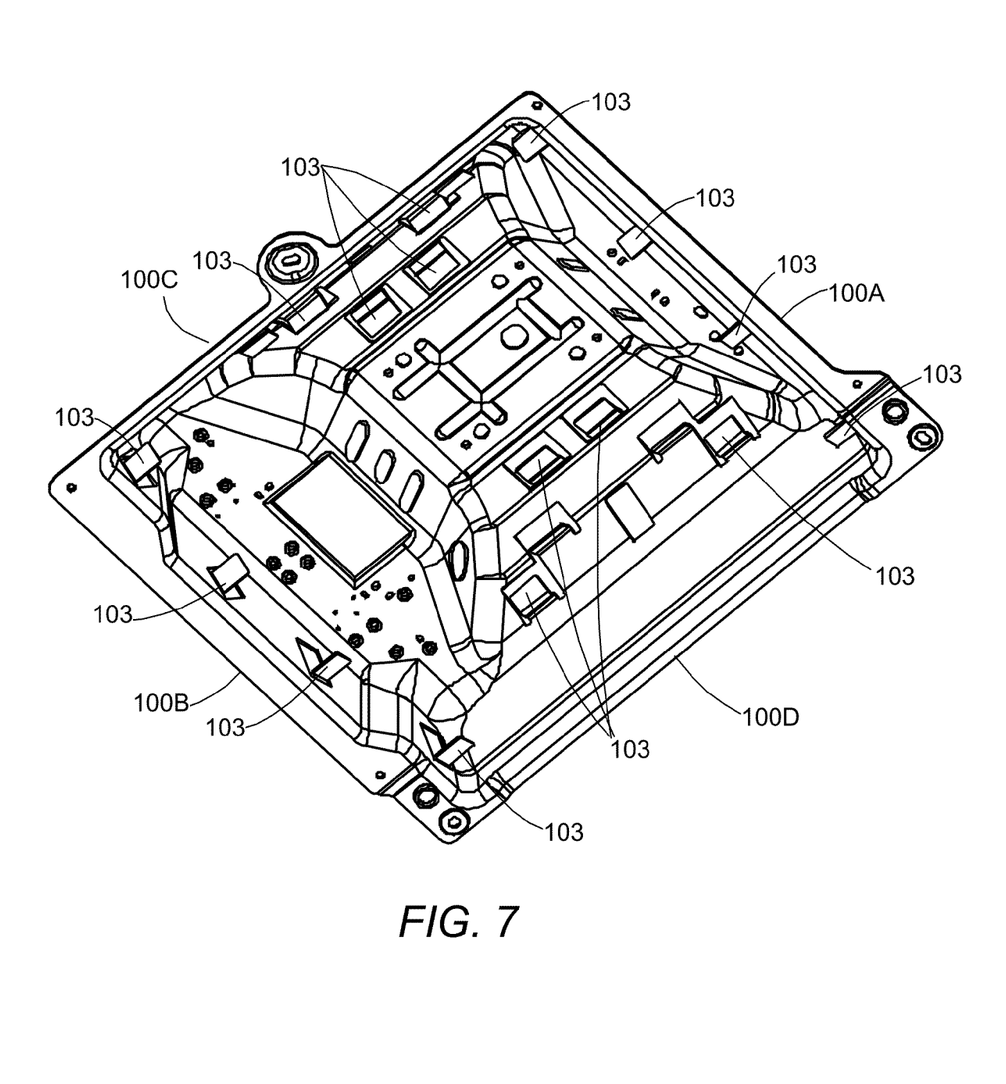
FIG. 7 is a bottom perspective view of the housing of FIG. 6.

According to an example embodiment, optical components forming post-scan assembly 101 may be disposed within the region substantially bounded by the inner surface of housing 100. Mirrors 102B, 104C, 106B and 108C may extend between one side 100A of housing 100 and an opposite side 100B thereof. Mirrors 102A, 104A and 104B may be mounted to and extend from a side 100C of housing 100 and mirrors 106A, 108A and 108B may be mounted to and extend from side 100D of housing 100. With reference to FIGS. 3 and 5, housing motor 71 and rotating polygonal mirror 70 may be mounted along the top of housing 100 along with mirrors 102A and 106A. Mirrors 104A, 104B and 108A, 108B as well as lenses 120A, 120B may be disposed closer and more proximal to a center region within housing 100. Mirrors 102B, 104C, 106B and 108C may be disposed along a lower region within housing 100.

Housing 100 has a rigid structure in order to keep the components of pre-scan assemblies 50, 60 and post-scan assemblies 101 in proper alignment with each other. In accordance with example embodiments, housing 100 is constructed from a metal composition, such as steel. Further, housing 100 may be formed using a deep draw stamping process. Housing 100 may be formed from a sheet of metal having, for example, a thickness of about 1 mm, though it is understood that smaller housings 100, for example, may be constructed from sheet metal having smaller thicknesses.

With reference to FIGS. 3-7, housing 100 may include a plurality of mounting surfaces 103 from which the components of post-scan assembly 101 are mounted. Mounting surfaces 103 may be arranged in groups of one or more for mounting a single component of post-scan assembly 101 to housing 100. For example, each mirror 102B, 104C, 106B and 108C may be mounted to and extend from a group of two mounting surfaces 103 which extend from opposed sides 100A and 100C of housing 100. Further, each of mirrors 102A, 104A and 104B may extend from a group of two mounting surfaces 103 that extend from side 100C of housing 100, and each of mirrors 106A, 108A and 108B may be mounted to and extend from a group of two mounting surfaces 103 which are disposed along the side 100D of housing 100. Each mounting surface 103 in a mounting surface group is sized and dimensioned for affixing a portion of a component of post-scan assembly 101 thereto. Each mounting surface may be substantially planar, and the mounting surfaces 103 in a group may be substantially planar with respect to each other. That way, a component of post-scan assembly 101 having a substantially planar mounting surface may be relatively easily mounted to the mounting surfaces 103 in a mounting surface group.

Mounting surfaces 103 may be formed from housing 100. In particular, following the formation of housing 100, such as through use of a deep draw process, individual areas of housing 100 may be partially cut therefrom and bent inwardly, thereby forming mounting surfaces 103. The bend angle of some mounting surfaces 103 may be approximately 90 degrees, such as the mounting surfaces 103 along sides 100A and 100B for mounting mirrors 102B, 104C, 106B and 108C. The bend angle of other mounting surfaces 103 may be less than 90 degrees, such as the mounting surfaces 103 extending from sides 100C and 100D for mounting mirrors 102A, 104B, 106A, and 108B. In an example embodiment, at least some of the mounting surfaces 103 may have a substantially rectangular planar surface to which a component of post-scan assembly 101 may be mounted. At least some of the mounting surfaces 103, such as for mounting mirrors 102B, 104C, 106B, 108C, 104A and 106A, may include and/or be associated with a single bend or crease, while other mounting surfaces, such as for mounting mirrors 102A, 104B, 106A and 108B, may be part of a larger projection which includes more than one bend or crease. It is understood that the number of bends and/or creases associated with a mounting surface 103 and their corresponding bend angles depend upon the particular components used in the post-scan optical assembly 101 and their desired positions and orientations relative to each other.

Figure 11:
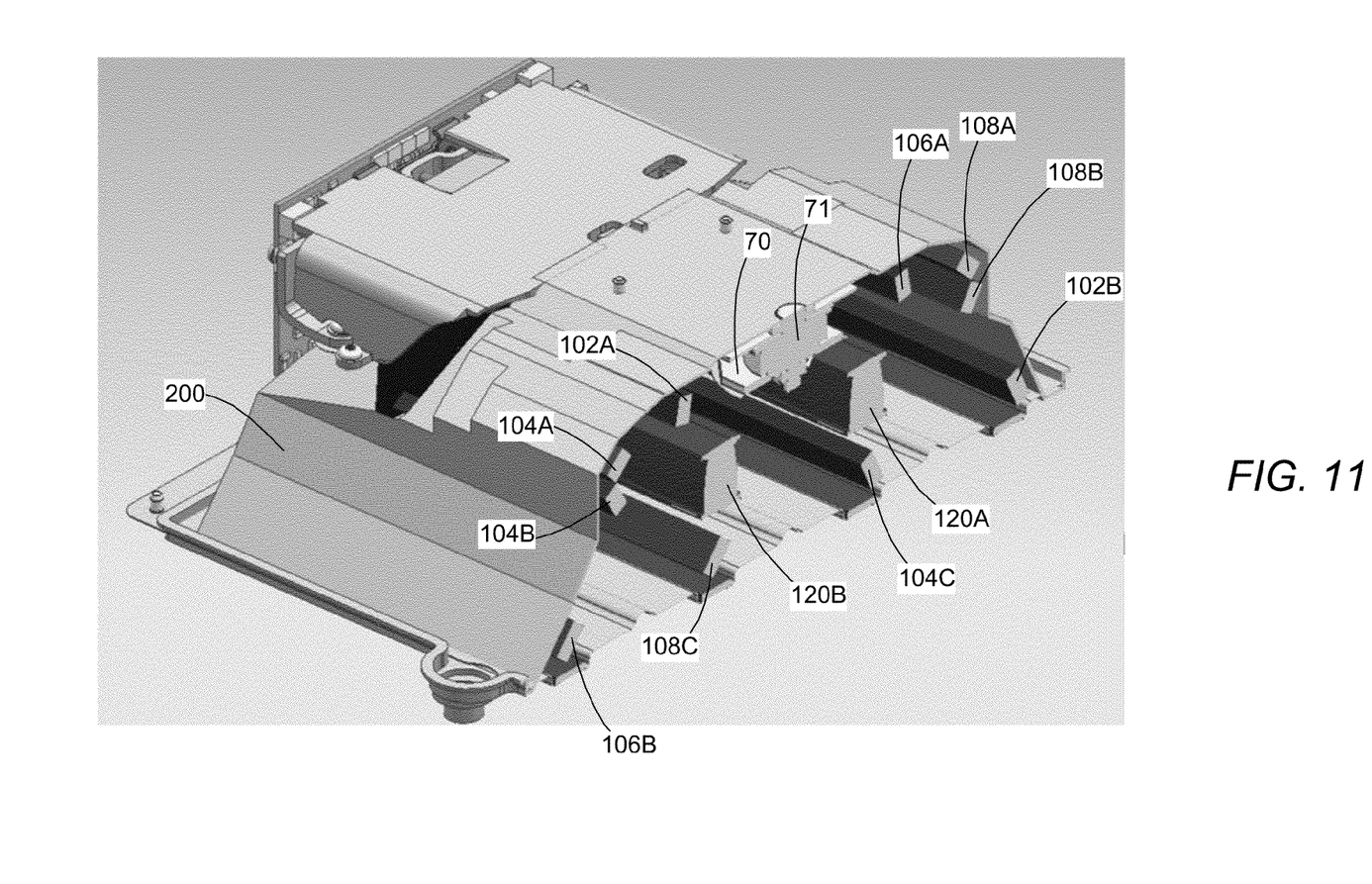
FIG. 11 is a perspective partial view of a scan unit according to another embodiment.
Figure 12:
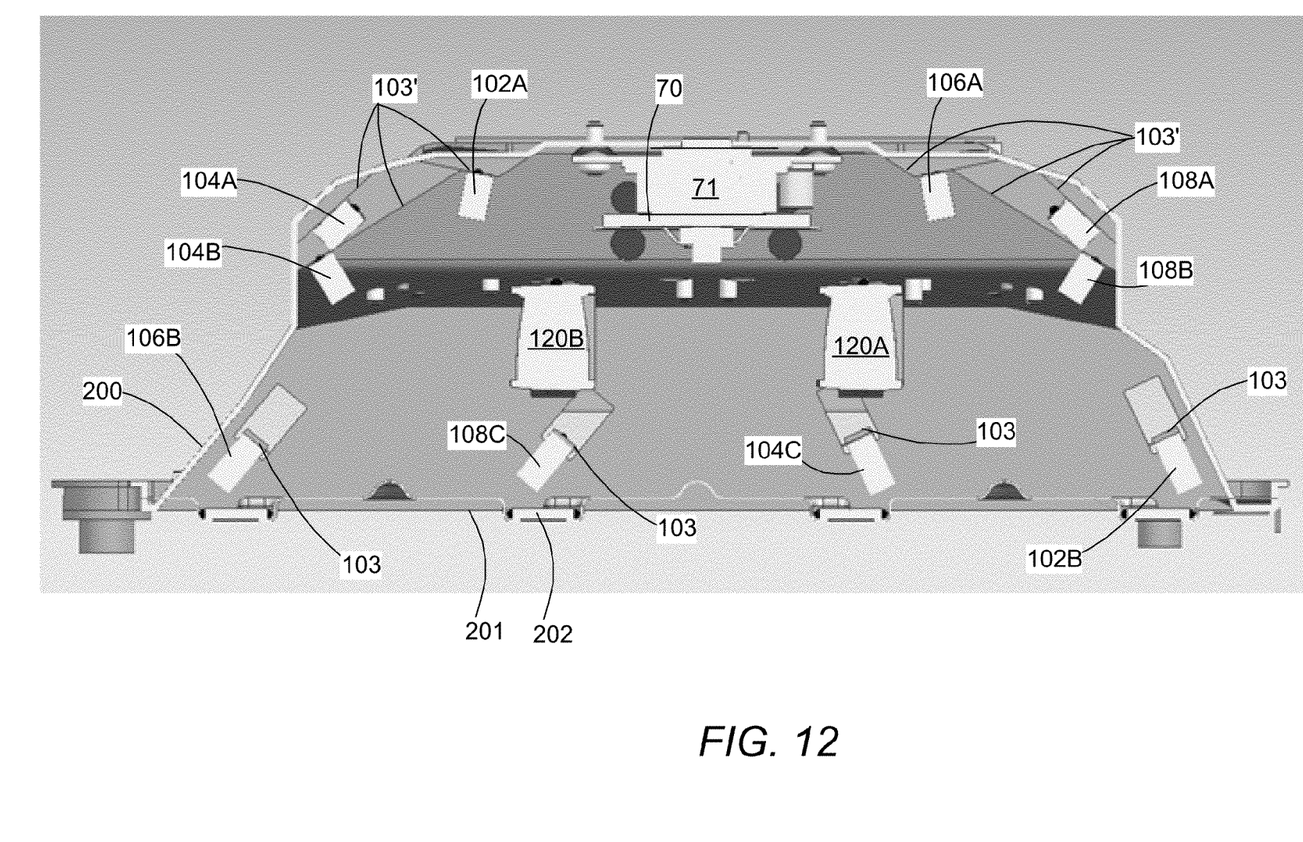
FIG. 12 is a cross sectional side view of the scan unit of FIG. 11.

Alternative embodiments may employ mounting surfaces that are formed other than by cutting a portion of housing 100 and bending the cut portion inwardly. Mounting surfaces 103 may thus have different shapes and dimensions from those depicted in the drawings. For example, mounting surfaces 103 may be formed during the process of forming housing 100, such as during a deep draw stamping process in which at least one flat surface is created to serve as the mounting surface, or during a post-formation process, such as by welding or otherwise permanently fixing a feature having a mounting surface to housing 100. In such alternative embodiments, a single component of post-scan optical assembly 101 may be secured to one or more mounting surfaces, such as one or more mounting surfaces that are substantially flat or planar FIGS. 11 and 12 illustrate a housing 200 for a printhead according to another embodiment. In this embodiment, housing 200 may include one or more mounting surfaces 103' that are not formed by cutting a portion of housing 200 and bending the cut portion inwardly as described above with respect to housing 100. Instead, mounting surfaces 103' may be formed, for example, following formation of housing 200. As a result, housing 200 includes less cutout portions than housing 100. FIGS. 11 and 12 further illustrate housing 200 including a bottom portion 201 having a plurality of windows and/or lenses 202 through which light beams 52A, 54A, 62A and 64A pass as the beams exit housing 200 and are directed towards photoconductive members 46.

Figure 8:
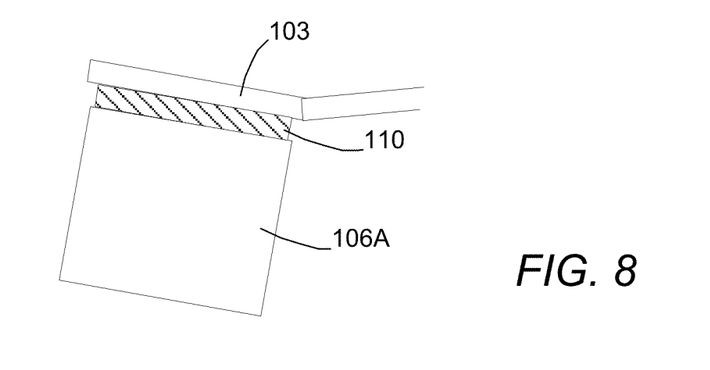
FIGS. 8 and 9 are side and bottom elevational views of a portion of the scan unit of FIG. 3 taken along the 8-8 and 9-9 lines, respectively, in FIG. 5.
Figure 9:
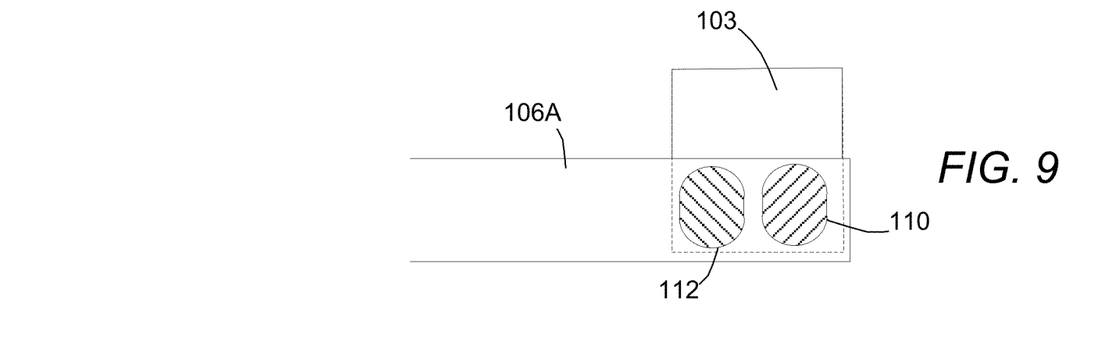

The components of post-scan optical assembly 101 are secured to mounting surfaces 103 using one or more adhesives. In particular, each mounting surface 103 used in securing a component of post-scan optical assembly 101 is separated from the component by the one or more adhesives 110, 112. In an example embodiment, the one or more adhesives may be a UV-curable adhesive, such as an OP-29 Series Multi-Purpose Optical Adhesive by DYMAX Corporation, Inc. of Torrington, Conn., and a pliable adhesive such as LOCTITE® 5512™ adhesive by Henkel Corporation. The adhesives 110, 112 may be disposed adjacent each other along each mounting surface 103, as shown in FIGS. 8 and 9 for mirror 106A. The thickness of the adhesives may be between about 0.1 mm and about 0.6 mm.

A benefit of housing 100 being constructed from metal, such as steel, is that housing 100 has a much lower coefficient of thermal expansion (CTE) than the CTE of thermoplastic housings described above. In addition, the direction of the thermal expansion of housing 100 is much more uniform, thereby reducing housing warping and the adverse affect of warping to the alignment of components of pre-scan assemblies 50, 60 and post-scan assembly 101. Further, because metal has a higher thermal conductivity than plastic, heat generated near one portion of housing 100 will cause little if any variation of heat across housing 101, thereby reducing variations in thermal expansion across the housing.

Yet another benefit of usage of housing 100 and securing components of post-scan optical assembly 101 thereto using one or more adhesives is that without the need for bulky mounting hardware for the components, the outer size of housing 100 is reduced.

Figure 10A:
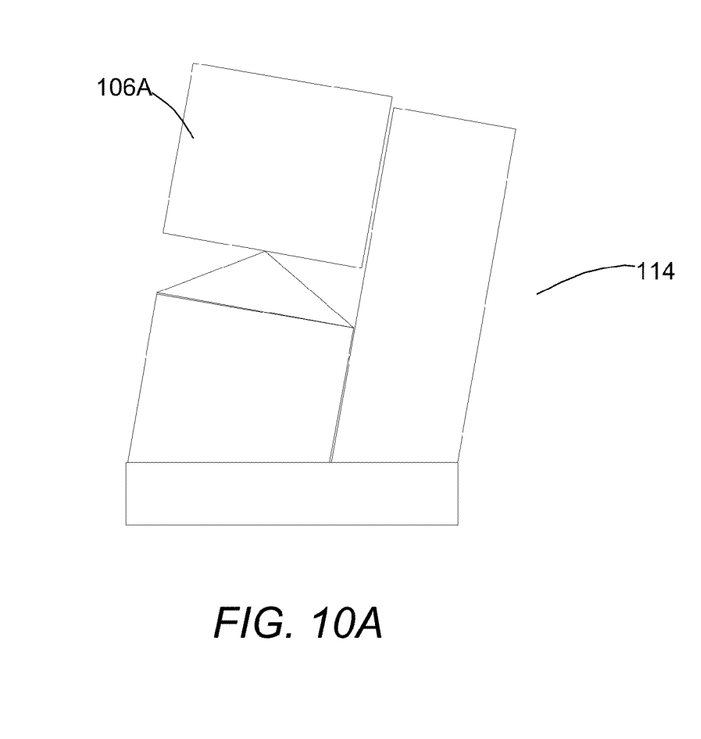
FIGS. 10A and 10B illustrate a method of assembling the scan unit of FIG. 3.
Figure 10B:
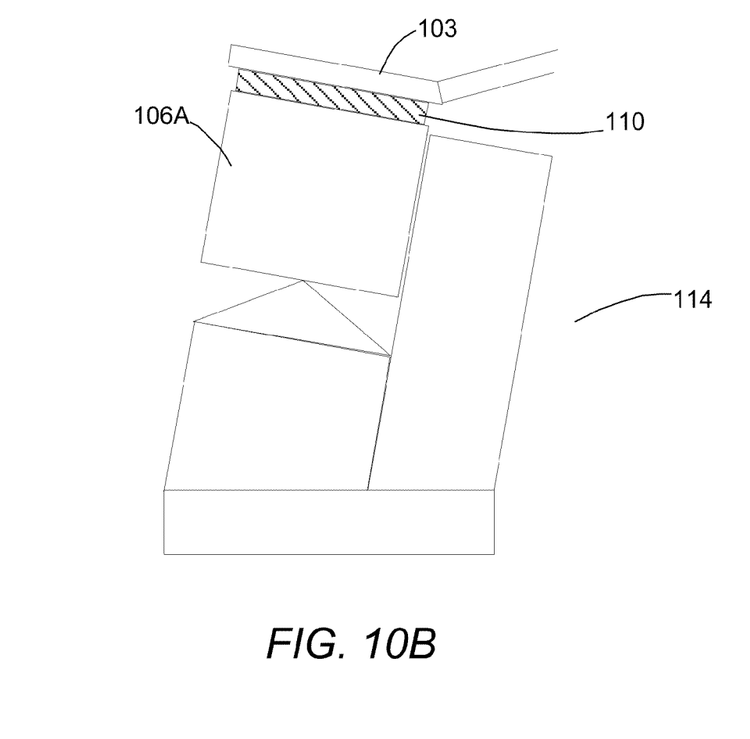

A method of producing or assembling printhead 34 will be presented below in accordance with an example embodiment. Initially, assembly fixtures for holding the components of post-scan optical assembly 101 are set, honed and/or adjusted as desired. Next, the components of post-scan optical assembly 101 are substantially optimally positioned in the fixture assembly so that datum surfaces of the components are substantially precisely located, without relying upon housing 101 for optimal positioning. FIG. 10A illustrates the positioning of mirror 106A to fixture 114. Next, housing 100 is located to the fixture assembly using the same features that will be subsequently used to locate housing 100 to a frame within imaging apparatus 10. Adhesives 110, 112 are then applied to fill the gap between components of post-scan optical assembly 101 and to bond such optical components to mounting surfaces 103 of housing 100, see FIG. 10B. The adhesives are cured or otherwise allowed to bond to the optical components while housing 100 is located to the fixture assembly. Adhesives 110, 112 can be seen to serve as liquid shims while securing the components to mounting surfaces 103 without the need for mounting clips or other hardware as used in prior printheads. Relatively precise alignment between the components of post-scan optical assembly 101 is maintained from the earlier component positioning to the fixture assembly.

It is understood that the above method for assembling printhead 34 is not necessarily limited to use of a metal housing but may instead utilize a thermoplastic housing. It is further understood that printhead 34 and the method of its assembly may be used in both multibeam and single beam imaging and/or scanning devices, including but not limited to color and monochrome laser printers.

Because of the use of a fixture assembly to precisely locate datum features of the components of printhead 34, and because the use of adhesives to secure non-datum surfaces of the components to housing 100, the above method of assembling printhead 34 advantageously allows for housing 100, whether it be constructed from metal or a plastic composition, to have looser tolerances than the tolerances of prior printhead housings.

As mentioned above, housing 100 may be formed using a deep draw process. Housing 100 may be further strengthened by utilizing secondary processes of toxing or welding tabs of the sheet metal back to itself. This creates additional rigidity.

In an alternative embodiment, housing 100 may be machine or die-cast.

The foregoing description of an embodiment has been presented for purposes of illustration. It is not intended to be exhaustive or to limit the application to the precise forms disclosed, and obviously many modifications and variations are possible in light of the above teaching. It is understood that the invention may be practiced in ways other than as specifically set forth herein without departing from the scope of the invention. It is intended that the scope of the application be defined by the claims appended hereto.

What is claimed is:

1. A scan unit for an imaging device, comprising:
a mirror movable about an axis;
one or more light sources, a light beam generated by each light source being directed toward the movable mirror such that movement of the mirror causes each light beam that is reflected by the mirror to follow a distinct scan pattern;
an optical assembly associated with each reflected light beam so as to form an optical path for the reflected light beam from the mirror, the optical assembly including at least one stationary mirror and at least one lens;
a housing to which the movable mirror, the one or more light sources and the optical assembly are secured, including a plurality of mounting surfaces, a first group of one or more of the mounting surfaces supporting the at least one stationary mirror of the optical assembly; and
at least one adhesive, each of the at least one stationary mirror mounted on and supported by the first group of one or more of the mounting surfaces via the at least one adhesive,
wherein for each of the at least one stationary mirror, the at least one adhesive is disposed between the at least one stationary mirror and the first group of one or more of the mounting surfaces so as to prevent any direct contact between the at least one stationary mirror and the first group of one or more of the mounting surfaces, and
wherein the at least one adhesive comprises at least two adhesives, the at least two adhesives being different types of adhesives.

2. The scan unit of claim 1, wherein the at least two adhesives comprise a first UV-curable adhesive and a second adhesive.

3. The scan unit of claim 1, wherein the at least two adhesive layers comprise a pliable adhesive.

4. The scan unit of claim 1, wherein each mounting surface is formed from the housing and includes at least one bend.

5. The scan unit of claim 1, wherein the first group of one or more mounting surfaces comprises surfaces that extend from a first pair of opposed sides of the housing.

6. The scan unit of claim 5, wherein the first group of one or more mounting surfaces extend from the housing at substantially orthogonal angles.

7. The scan unit of claim 1, wherein the first group of one or more mounting surfaces comprises at least two surfaces that are substantially planar with respect to each other.

8. The scan unit of claim 1, wherein at least one second group of one or more mounting surfaces extend from a top portion of the housing.

9. The scan unit of claim 1, wherein the at least two adhesives have a thickness between about 0.1 mm and about 0.6 mm.

10. The scan unit of claim 1, wherein the housing comprises a metal housing.

11. The scan unit of claim 1, wherein for each of the at least one stationary mirror, the at least one stationary mirror is secured to the first group of one or more of the mounting surfaces by only the at least two adhesives.

12. An imaging device, comprising:
a scan unit, comprising:
a mirror movable about an axis;
at least one light source, a light beam generated by each light source being directed towards the movable mirror such that movement of the mirror causes each light beam that is reflected by the mirror to follow a distinct scan pattern;
an optical assembly associated with each reflected light beam and forming an optical path for the reflected light beam from the mirror, the optical assembly including at least one mirror that is stationary during operation of the imaging device and at least one lens;
a housing to which the movable mirror, the at least one light source and the optical assembly are secured, including a plurality of mounting surfaces, at least one mounting surface of the mounting surfaces supporting the at least one stationary mirror of the optical assembly; and
for each of the at least one stationary mirror, at least one adhesive is disposed between the at least one mounting surface and the at least one stationary mirror, the at least one stationary mirror secured to the at least one mounting surface by only the at least one adhesive,
wherein for each of the at least one stationary mirror, the at least one stationary mirror is separated from the at least one mounting surface by the at least one adhesive along all portions of the at least one stationary mirror, and the at least one adhesive comprises a first adhesive and a second adhesive disposed proximally to the first adhesive, the first adhesive being a different type of adhesive from a type of adhesive of the second adhesive.

13. The imaging device of claim 12, wherein the housing is constructed from one of a metal and a plastic.

14. The imaging device of claim 12, wherein the at least one mounting surface supporting the at least one stationary mirror comprises at least two mounting surfaces which extend from opposed sides of the housing.

15. The imaging device of claim 12, wherein the at least one mounting surface supporting the at least one stationary mirror comprise a plurality of mounting surfaces that are substantially planar with each other.

16. The imaging device of claim 12, wherein each mounting surface comprises a portion of the housing bent inwardly therefrom.

17. The imaging device of claim 12, wherein the first adhesive and the second adhesive have compositions that are different from each other.

18. The imaging device of claim 12, wherein the first adhesive comprises a pliable adhesive.

19. A scan unit for an imaging device, comprising:
a mirror movable about an axis;
one or more light sources, a light beam generated by each light source being directed towards the movable mirror such that movement of the mirror causes each light beam that is reflected by the mirror to follow a distinct scan pattern;
an optical assembly associated with each reflected light beam so as to form an optical path for the reflected light beam from the mirror, the optical assembly including at least one stationary mirror and at least one lens;
a housing to which the movable mirror, the one or more light sources and the optical assembly are secured, including a plurality of mounting surfaces, a first group of one or more of the mounting surfaces supporting the at least one stationary mirror of the optical assembly; and
at least one adhesive, wherein for each of the at least one stationary mirror, the at least one stationary mirror is mounted on and supported by the first group of one or more of the mounting surfaces via the at least one adhesive, the at least one adhesive comprising at least two adhesives, the at least two adhesives being different types of adhesives.

* * * * *